US007561805B2

(12) United States Patent
Aoki et al.

(10) Patent No.: US 7,561,805 B2
(45) Date of Patent: Jul. 14, 2009

(54) OPTICAL TRANSMITTER, OPTICAL RECEIVER, OPTICAL COMMUNICATION SYSTEM, AND OPTICAL TRANSMITTER AND RECEIVER

(75) Inventors: Hiroatsu Aoki, Tokyo (JP); Seishi Notomi, Tokyo (JP)

(73) Assignee: FiBest, Ltd. (JP)

( * ) Notice: Subject to any disclaimer, the term of this patent is extended or adjusted under 35 U.S.C. 154(b) by 498 days.

(21) Appl. No.: 10/970,695

(22) Filed: Oct. 20, 2004

(65) Prior Publication Data

US 2005/0094686 A1    May 5, 2005

(30) Foreign Application Priority Data

Oct. 31, 2003   (JP)   ............... 2003-372730

(51) Int. Cl.
*H04B 10/04* (2006.01)
*H04B 10/00* (2006.01)
(52) U.S. Cl. .................. 398/182; 398/135; 398/138; 398/164; 398/201; 398/202; 398/212; 372/34; 372/36
(58) Field of Classification Search ............. 372/34, 372/36; 398/138, 182, 200, 201, 202, 212, 398/214
See application file for complete search history.

(56) References Cited

U.S. PATENT DOCUMENTS

| 5,845,031 | A * | 12/1998 | Aoki ................... 385/92 |
| 6,116,792 | A * | 9/2000 | Kosugi ................. 385/92 |
| 6,155,724 | A * | 12/2000 | Ichino et al. ............ 385/92 |
| 6,609,838 | B1 * | 8/2003 | Branch et al. ........... 385/92 |
| 6,623,180 | B2 * | 9/2003 | Panicker et al. ......... 385/92 |
| 6,647,039 | B2 * | 11/2003 | Fu et al. ............... 372/36 |
| 6,677,570 | B1 * | 1/2004 | Kogan et al. ........... 250/214 A |
| 7,046,936 | B2 * | 5/2006 | Aruga ................. 398/202 |
| 7,120,178 | B2 * | 10/2006 | Kozlovsky et al. ....... 372/36 |
| 2002/0105984 | A1 * | 8/2002 | Yamamoto et al. ....... 372/44 |
| 2002/0162338 | A1 | 11/2002 | Shimada et al. |
| 2003/0029051 | A1 | 2/2003 | Epitaux et al. |

(Continued)

FOREIGN PATENT DOCUMENTS

JP         03-120884         5/1991

(Continued)

OTHER PUBLICATIONS

European search report for application EP 04 25 6552, Feb. 22, 2005.*

(Continued)

*Primary Examiner*—Ken N Vanderpuye
*Assistant Examiner*—Daniel G Dobson
(74) *Attorney, Agent, or Firm*—Townsend and Townsend and Crew LLP; Kenneth R. Allen

(57) ABSTRACT

An optical transmitter has a case. The case houses a laser beam generator, a lens, a cooler, and a high heat conductivity member. The lens concentrates the laser beam generated by the laser beam generator and leads the laser beam to an optical fiber. The high heat conductivity member is arranged between the laser beam generator and the lens and the cooler. The laser beam generator has higher heat conductivity than that of the case. The laser beam generator conveys the heat generated in the laser beam generator to the cooler.

18 Claims, 11 Drawing Sheets

U.S. PATENT DOCUMENTS

| | | |
|---|---|---|
| 2003/0159844 A1 | 8/2003 | Wolf et al. |
| 2003/0193095 A1 | 10/2003 | Sasaki et al. |
| 2004/0062491 A1* | 4/2004 | Sato et al. .................... 385/88 |
| 2004/0208211 A1 | 10/2004 | Maruyama et al. |

FOREIGN PATENT DOCUMENTS

| | | |
|---|---|---|
| JP | 08-179170 | 7/1996 |
| JP | 11-248973 | 9/1999 |
| JP | 2000-277843 | 10/2000 |
| JP | 2002-82261 A | 3/2002 |
| JP | 2003-215406 | 7/2003 |
| JP | 2003-249711 A | 9/2003 |
| JP | 2003-264331 | 9/2003 |
| WO | WO 98/35410 A1 | 8/1998 |
| WO | WO 03/025652 A1 | 3/2003 |
| WO | WO 03/069744 A1 | 8/2003 |

OTHER PUBLICATIONS

Sepulveda, Juan et al. "Advanced Power Packaging Using Copper-Tungsten Composites" SMTA International Proceedings of the Technical Program 2001 Surface Mount Technology Association, 2001.

Velsher "High-Speed optoelectronic packaging" GAAS IC Symposium, 24th Annual IEEE Gallum Arsenide Integrated Circuit Symposium Technical Digest Oct. 20-23, 2002 pp. 15-18 IEEE Gallium Arsenide Integrated Circuit Symposium New York New York.

Rue et al. "High performance 10 GB/s pin and APD Optical receivers" 1999 Proceedings 49th. Electronic components and Technology Conference Jun. 1-4, 1999, Proceedings of the Electronic Components and Technology Conference.

* cited by examiner

OPTICAL TRANSMITTER, OPTICAL RECEIVER, OPTICAL COMMUNICATION SYSTEM, AND OPTICAL TRANSMITTER AND RECEIVER

BACKGROUND OF THE INVENTION

1) Field of the Invention

The present invention relates to devices used in the optical communications.

2) Description of the Related Art

FIG. 11 is an external view of an optical transmitter 10 and an optical receiver 20 in a conventional optical communication system.

The optical transmitter 10 transmits a laser beam via an optical fiber 14. The optical transmitter 10 includes a case 11. The case 11 houses a laser beam generator (not shown) that generates a laser beam, a first supporting (not shown) member that supports the laser beam generator, a lens (not shown) that concentrates the laser beam from the laser beam generator, a second supporting member (not shown) that supports the lens, a member (not shown) via which the first support member and the second support member are attached to each other, and a cooler (not shown) that cools down heat generated in the laser beam generator and the lens. The member (hereinafter, "high weldability member") via which the first support member and the second support member are attached to each other is easy to weld.

The high weldability member is made of a material whose weldability by YAG welding is high (therefore robust welding may be made) such as KOVAR®,which is a Fe-Co-Ni alloy. The cooler is of a type that performs cooling, for example, based on Peltier effect. In the Peltier effect, when weak current flows through a joint of two metal plates, heat transfers from one plate to the other plate. A driver 12 is arranged outside of the case 11. The driver 12 drives and controls the laser beam generator via a lead wire having a line length. An end of an optical fiber 14 is inserted into and fixed to an optical fiber tube 13.

As the laser beam generator is driven under the control of the driver 12. a laser beam is ejected from the laser beam generator. This laser beam is concentrated by the lens. The concentrated laser beam enters an incident surface of the optical fiber 14, and goes out through the optical fiber 14.

Meanwhile, heat generated in the laser beam generator and the lens is conveyed to the cooler via the first support member, the second support member, and the high weldability member. As a result, the temperature in the case 11 is maintained below a temperature guarantees proper functioning of the device.

Because large amount of heat is generated in the laser beam generator and the lens, a cooler with a high performance is used. A high performance cooler generally has a large size. As a consequence, the overall size of the optical transmitter 10 exceeds 30 millimeters.

On the other hand, the optical receiver 20 receives a laser beam via an optical fiber 23. The optical receiver 20 includes a case 21. The case 21 houses a lens (not shown) that concentrates the laser beam from the optical fiber 23, a photo diode (not shown) that receives the laser beam and converts the laser beam into electric signals, and a preamplifier (not shown) that amplifies the electric signals. An end of the optical fiber 23 is inserted into and fixed to an optical fiber tube 22.

A laser beam comes in through the optical fiber 23 and ejected from an outgoing surface of the optical fiber 23. The laser beam is concentrated by the lens, and converted into electric signals by the photo diode. The electric signals are amplified by the preamplifier.

A conventional technology has been disclosed in Japanese Patent Application Laid-Open Publication No. 2002-82261.

Recently there has been a high demand that the optical communication system be high speed (of the order of several tens of gigabits per second) and compact. See, for example, XFP (10 Gigabit Small Form Factor Pluggable) standard.

According to the XFP standard, the distance between the optical axis of the optical transmitter and that of the optical receiver be 6 millimeters. However, in the conventional optical transmitter and the optical receiver, it is not possible to achieve such compactness. Precisely, due to the large-sized cooler, as mentioned above, the overall size cannot be made smaller.

Moreover, because the driver 12 is positioned outside of the optical transmitter 10, a line length of the lead line between the driver 12 and the laser beam generator becomes longer. As a result, high frequency properties of the optical transmitter deteriorate.

Furthermore, because the photo diode and the preamplifier are arranged inside the case 21 of the optical receiver 20, the operations for exchanging the photo diode and the preamplifier become cumbersome. Moreover, testing of the device becomes difficult. Moreover, design of the optical receiver cannot be changed so easily.

SUMMARY OF THE INVENTION

It is an object of the present invention to solve at least the problems in the conventional technology.

An optical transmitter according to an aspect of the present invention includes a case; a laser beam generating unit that is arranged in the case and generates a laser beam; a lens that is arranged in the case and leads the laser beam to an optical fiber; a cooling unit that is arranged in the case; and a high heat conductivity member that is arranged in between the laser beam generating unit and the lens and the cooling unit, wherein the high heat conductivity member has higher heat conductivity than the case, and leads heat generated in the laser beam generating unit to the cooling unit.

An optical communication system according to another aspect of the present invention includes the above optical transmitter.

An optical receiver according to still another aspect of the present invention includes a case; a light receiving unit that is arranged in the case, and coverts a laser beam that comes through the optical fiber into electric signals; an amplifying unit that is arranged in the case, and amplifies the electric signals; and a support member that supports the light receiving unit and the amplifying unit in detachable manners in unit of block.

An optical communication system according to still another aspect of the present invention includes the above optical receiver.

An optical transmitter and receiver according to still another aspect of the present invention includes the above optical transmitter and the above optical receiver.

The other objects, features, and advantages of the present invention are specifically set forth in or will become apparent from the following detailed description of the invention when read in conjunction with the accompanying drawings.

DETAILED DESCRIPTIONS

Exemplary embodiments of an optical transmitter, an optical receiver, an optical communication system, and an optical transmitter and receiver according to the present invention are described below in detail in reference to accompanying drawings. The present invention is not limited to the embodiment.

Figure 1:
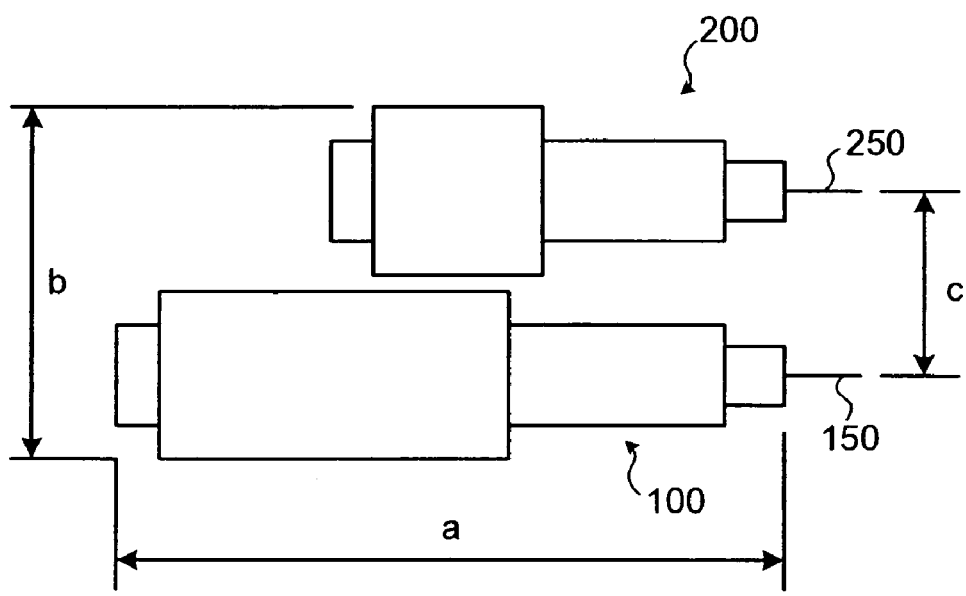
FIG. 1 is a top view of an optical transmitter and an optical receiver used in an optical communication system according to an embodiment of the present invention.

FIG. 1 is a top view of an optical transmitter and an optical receiver used in an optical communication system according to an embodiment of the present invention. The optical communication system is based on the XFP standard.

The length a of an optical transmitter 100 is 28 millimeters, the total breadth b of the optical transmitter 100 and the optical receiver 200 is 12 millimeters, and the distance c between optical axes of the optical transmitter 100 and the optical receiver 200 is 6 millimeters. These values satisfy the XFP standard.

Figure 2:
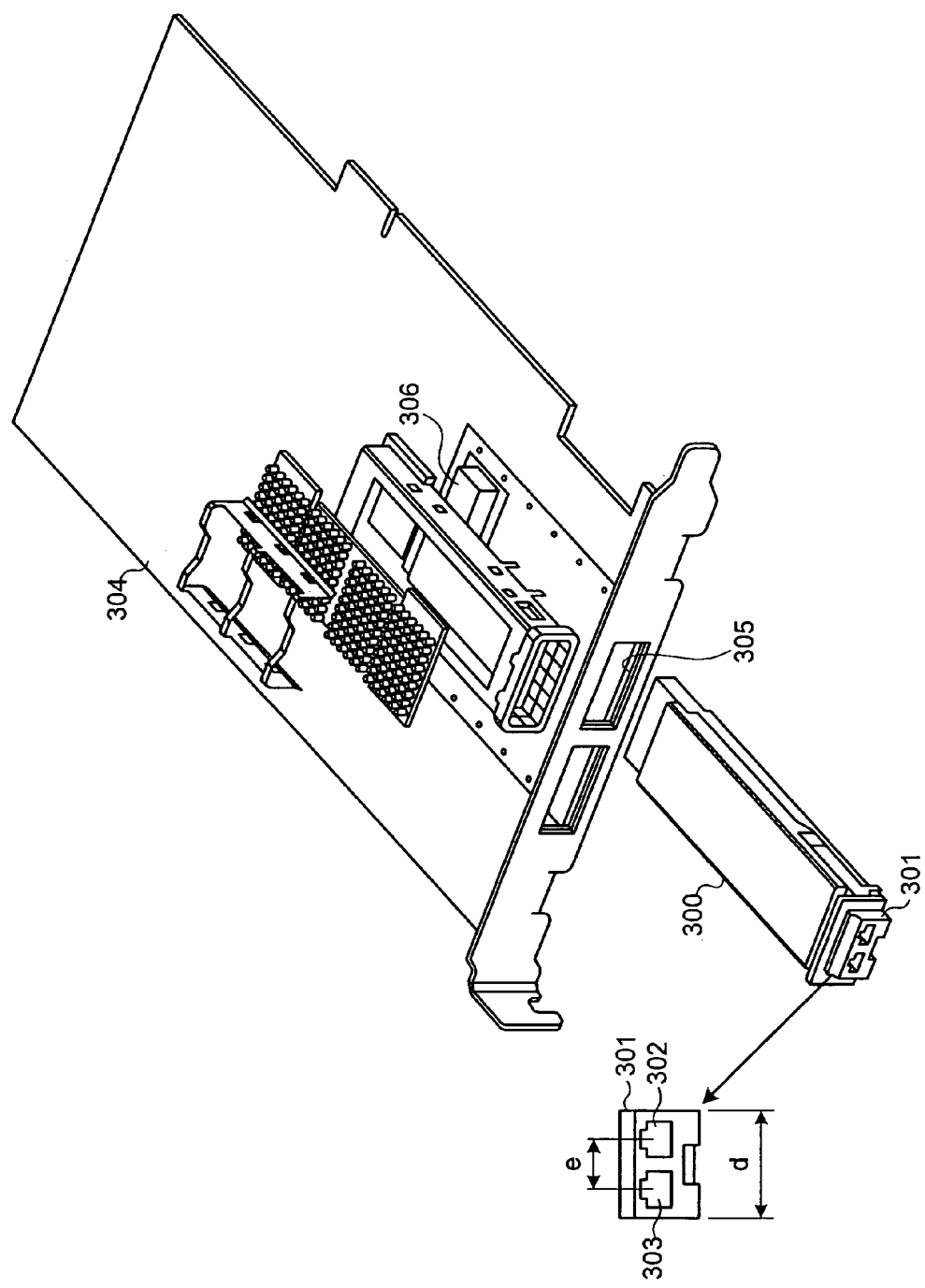
FIG. 2 is a perspective view of an application example of the embodiment.

FIG. 2 is perspective view of an XFP standardized optical transmitter and receiver 300 that uses the optical transmitter and the optical receiver according to the embodiment. The XFP standardized optical transmitter and receiver 300 includes a case 301.

The case 301 houses the optical transmitter 100 and the optical receiver 200. The case 301 includes an optical receiver insertion port 302 and an optical transmitter insertion port 303. The optical receiver 200 is inserted into the optical receiver insertion port 302, and the optical transmitter 100 is inserted into the optical transmitter insertion port 303. The width d of the case 301 is 18.35±0.1 millimeters. Moreover, the distance e, which is the between optical axes of the optical receiver insertion port 302 and the optical transmitter insertion port 303 is 6.0 millimeters.

A board 304 is inserted into an extension slot or the like of a computer device that carries out optical communications at 10 Gigabits per second. A connector 306 and other circuitry are arranged on the board 304. The XFP standardized optical transmitter and receiver 300 can be connected to the connector 306 by inserting the XFP standardized optical transmitter and receiver 300 into an insertion port 305 provided to the board 304.

Figure 3:
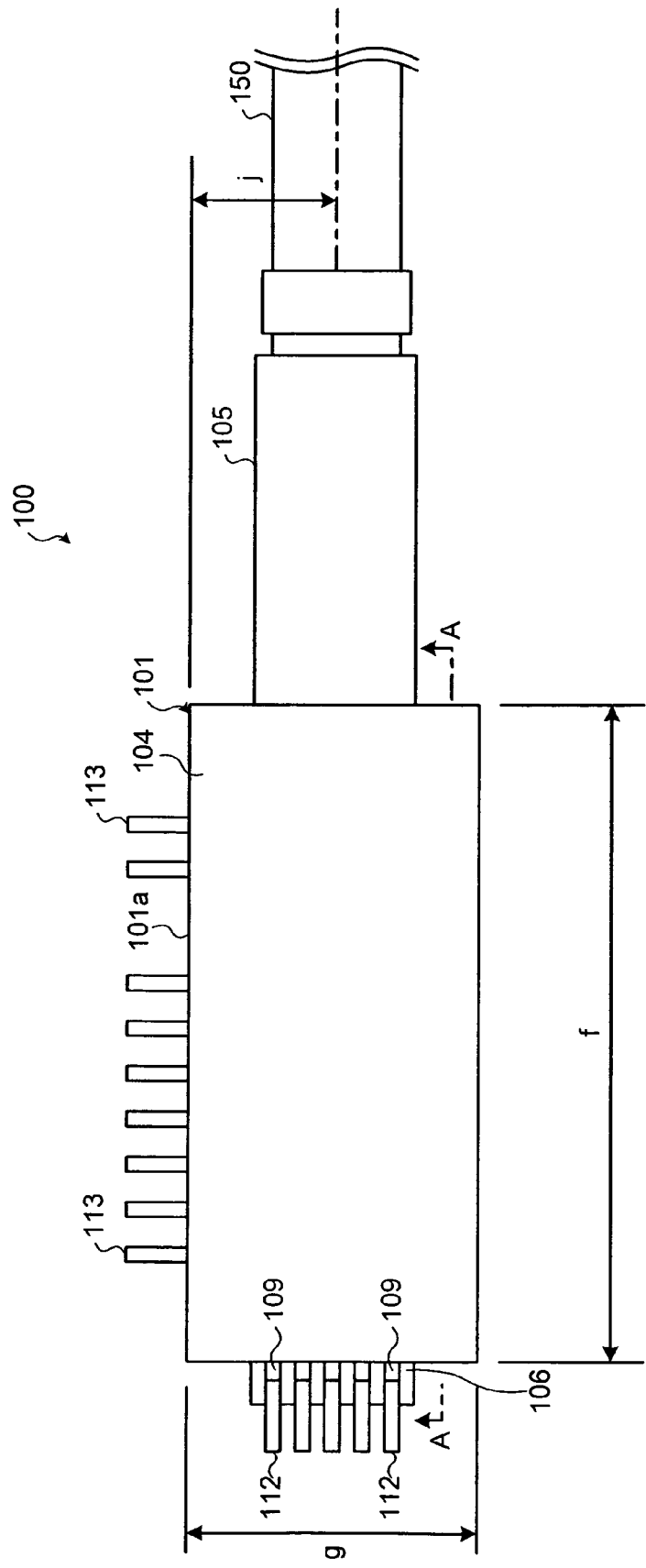
FIG. 3 is an enlarged top view of an external structure of an optical transmitter 100 shown in FIG. 1.
Figure 4:
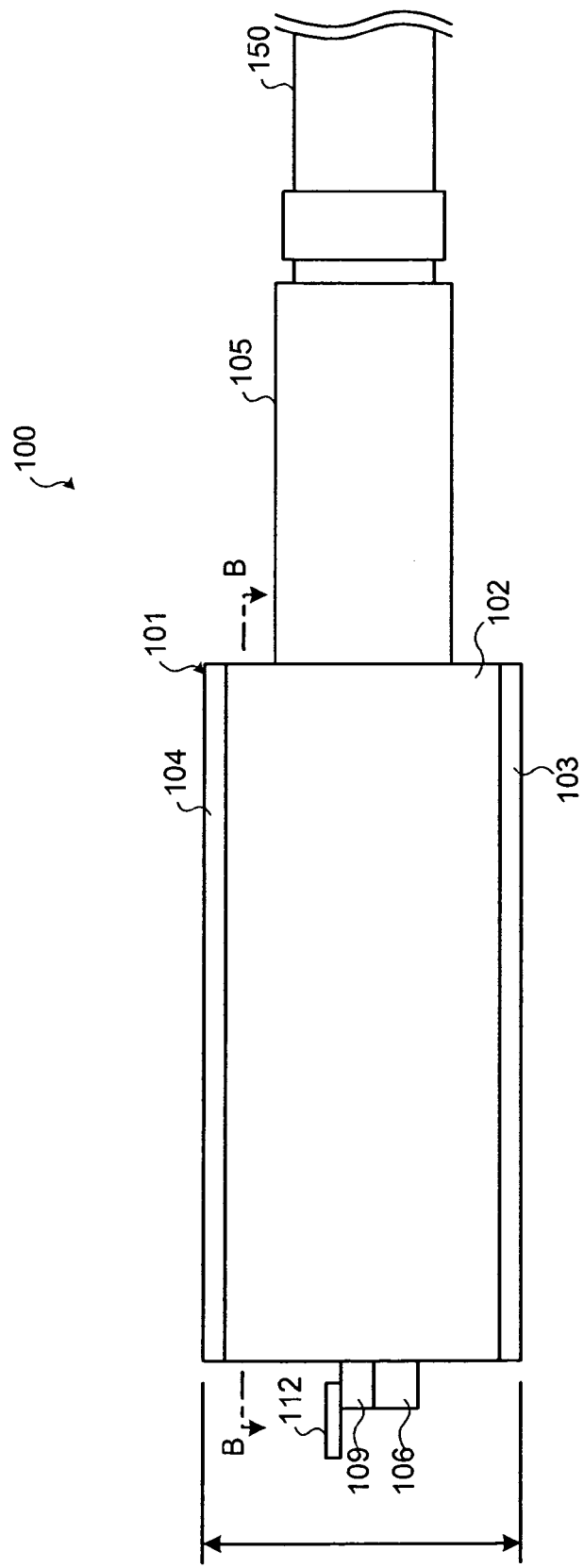
FIG. 4 is an enlarged side view of an external structure of the optical transmitter 100 shown in FIG. 1.
Figure 5:
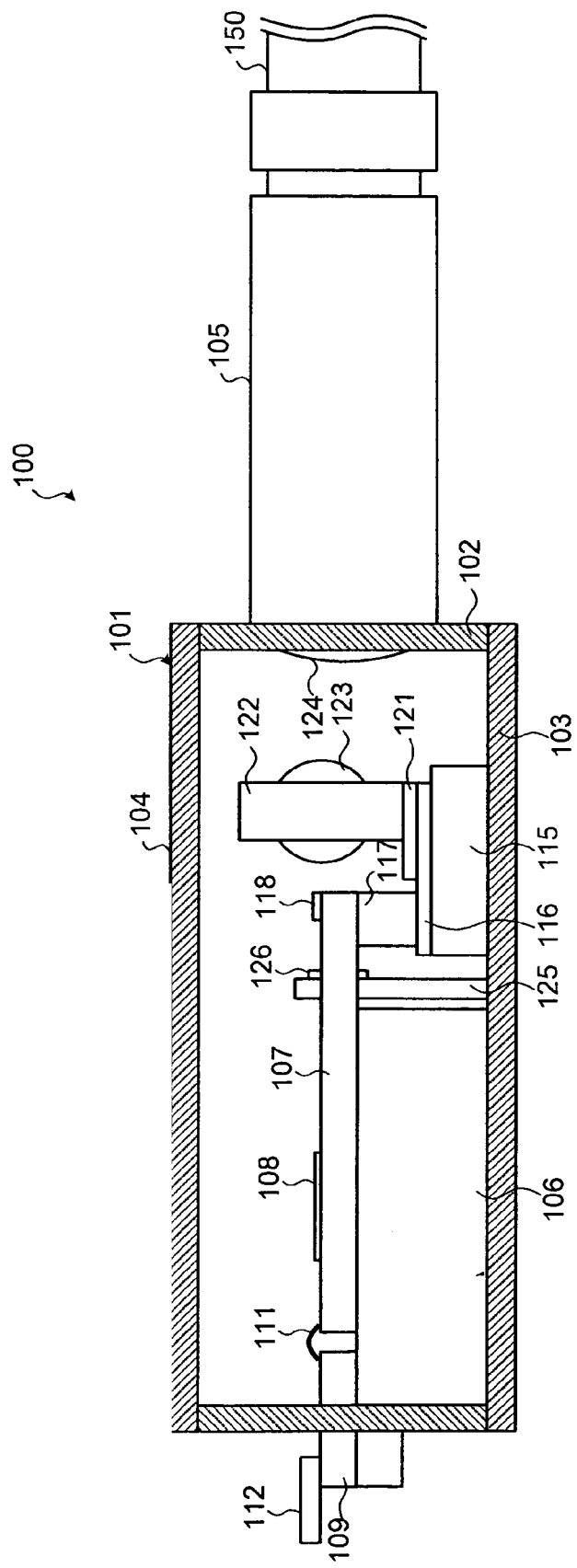
FIG. 5 is a cross sectional view along the line A-A' shown in FIG. 3.
Figure 6:
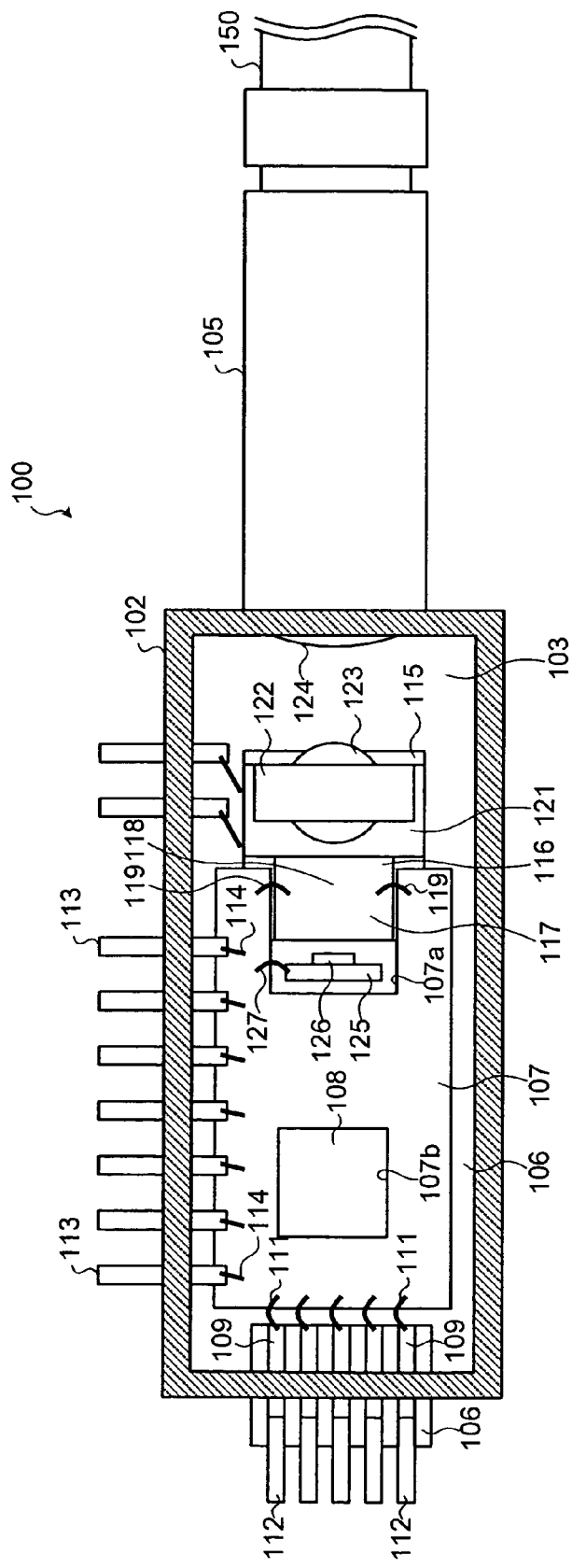
FIG. 6 is a cross sectional view along the line B-B' shown in FIG. 4.

The structure of the optical transmitter 100 is explained in details hereinafter. FIG. 3 is an enlarged external view of the optical transmitter 100. FIG. 4 is an enlarged external view of the optical transmitter 100 from a different side. FIG. 5 is a cross sectional view along the line A-A' shown in FIG. 3. FIG. 6 is a cross sectional view along the line B-B' shown in FIG. 4.

The optical transmitter 100 includes a case 101. The case 101 is rectangular and hollow. The case includes an enclosure member 102 having a rectangular cross section (Refer to FIG. 6.), a lower member 103 that coversthe lower surface of the enclosure member 102, and an upper member 104 that covers the upper surface of the enclosure member 102. This case 101 is made of a material having low heat conductivity, such as a Fe-Co-Ni ally. The lower member 103 is made of copper tungsten or the like having high heat conductivity. The case 101 houses a driver 108, a cooler 115, a laser generator 118, a first lens 123 and the like.

As shown in FIG. 5, an optical fiber tube 105 is jointed to the enclosure member 102. Into this optical fiber tube 105, an optical fiber 150 is inserted and fixed thereto. A base 106 is of a roughly rectangular solid shape, and is arranged in the left half area in the figure of the lower member 103. This base 106 is made of copper tungsten and the like having a high heat conductivity. The left portion in the figure of the base 106 is formed to protrude outside. A high frequency board 107 is made of a ceramic material and the like such as alumina that has excellent high frequency properties, and is arranged onto the base 106.

On the high frequency board 107 shown in FIG. 6, a roughly inverted unshaped notched portion 107a, and a square hole 107b to meet the shape of a driver 108 are formed. The driver 108 has a function to drive and control a laser beam generator 118 to be described later herein, and is packaged onto the base 106 in a status contained in the square hole 107b. Meanwhile, heat generated in the driver 108 is spontaneously radiated via the base 106 and the lower member 103. On the surface of the high frequency board 107, wiring patterns are formed.

Relay terminals 109 are arranged on the base 106 at specified intervals, and part of each thereof protrudes outside from the enclosure member 102. These relay terminals 109 are connected via wires 111 to the respective wire patterns on the base 106.

Terminals 112 are jointed to the relay terminals 109. Terminals 113 are arranged at specified intervals to protrude outside from the enclosure member 102, and are connected via wires 114 to the respective wiring patterns on the high frequency board 107.

The cooler 115 shown in FIG. 5 is of roughly rectangular shape, and is arranged on the right of the base 106 in the lower member 103. This cooler 115 is a type that leads the heat generated in the laser beam generator 118, by use of the Peltier effect mentioned previously. This cooler 115 is made into a smaller size than that of the cooler used in the optical transmitter 10 mentioned previously (Refer to FIG. 11) through a contrivance to increase heat efficiency.

The contrivance to increase heat efficiency is that a high heat conductivity member 116 is arranged onto the surface of the cooler 115, and further a low-heat-conductivity/high-weldability member 121 is arranged on the half portion of the high heat conductivity member 116, thereby heat efficiency (heat reduction) is increased in comparison with the conventional art.

The high heat conductivity member 116 is made of a material (for example, copper tungsten) whose heat conductivity is higher than that of the conventional Fe-Co-Ni alloy. (the material of the case 101), and is jointed onto the surface of the cooler 115.

A support member 117 supports the laser beam generator 118. The support member 117 is made of a ceramic material or aluminum nitrogenous or the like. The support member 117 is jointed to the high heat conductivity member 116 by soldering or the like. This support member 117 is made of a material having high heat conductivity. The low-heat-conductivity/high-weldability member 121 is made of a material (for example, a Fe-Co-Ni alloy) having heat conductivity lower than that of the high heat conductivity member 116, and having weldability by YAG welding higher than that of the high heat conductivity member 116. The low-heat-conductivity/high-weldability member 121 covers substantially half of the surface of the high heat conductivity member 116.

This low-heat-conductivity/high-weldability member 121 has an area roughly half of that of the high heat conductivity member 116. The support member 117 is arranged in a position that is contained in the notched portion 107a (Refer to FIG. 6.).

A support member 122 supports a first lens 123, and is made of SUS or a Fe-Co-Ni alloy. or the like. This support member 122 is jointed to the low-heat-conductivity/high-weldability member 121 by YAG welding. The low-heat-conductivity/high-weldability member 121 arranged between the support member 122 and the high heat conductivity material 116 allows firm fixing of the support member 122.

Further, the low-heat-conductivity/high-weldability member 121 functions as a heat barrier, and reduces the amount of heat, which is generated in the laser beam generator 118, conveyed toward the lens 123. Moreover, the low-heat-conductivity/high-weldability member 121 efficiently conveys the heat to the cooler 115.

The laser beam generator 118 shown in FIG. 6 is positioned in the notched portion 107a and is arranged on the surface of the support member 117, and is driven and controlled by the driver 108. This laser generator 118 generates a laser beam toward the first lens 123.

Wires 119 connect the wiring patterns formed on the high frequency board 107, and the wiring patterns formed on the surface of the support member 117. Accordingly, the driver 108 is electrically connected to the laser beam generator 118 via the wiring patterns of the high frequency board 107, wires 119 and the wiring patterns of the support member 117, and thereby drives and controls the laser beam generator 118.

Back to FIG. 5, the first lens 123 is arranged in on the right of the laser beam generator 118, and converts the laser beam from the laser beam generator 118 into parallel light rays. A second lens 124 is arranged on the right of the first lens 123, and concentrates the parallel light rays from the first lens 123, and guides them to the incident surface of an optical fiber 150.

A support member 125 is arranged in between the base 106 and the cooler 115, and is positioned in the notched portion 107a shown in FIG. 6. This support member 125 supports a measuring photo diode 126. The measuring photo diode 126 is a photo diode that measures the laser beam generated by the laser beam generator 118.

A wire 127 connects the wiring patterns formed on the high frequency board 107, and the wiring patterns formed on the surface of the support member 125. Accordingly, the measuring photo diode 126 is electrically connected to the wiring patterns of the high frequency board 107 via the wiring patterns of the support member 125 and the wire 127.

Because the laser beam generator 118 and the measuring photo diode 126 are arranged in the notched portion 107a, it becomes possible to make the size compact and still maintain high frequency properties.

Precisely, if the laser beam generator 118 and the measuring photo diode 126 are not arranged in the notched portion 107a, longer wires 119, 127 are required, which causes the high frequency properties to deteriorate. On the other hand, if the laser beam generator 118 and the measuring photo diode 126 are arranged in the notched portion 107a, shorter wires 119, 127 may be used so that the high frequency properties can be maintained.

Figure 11:
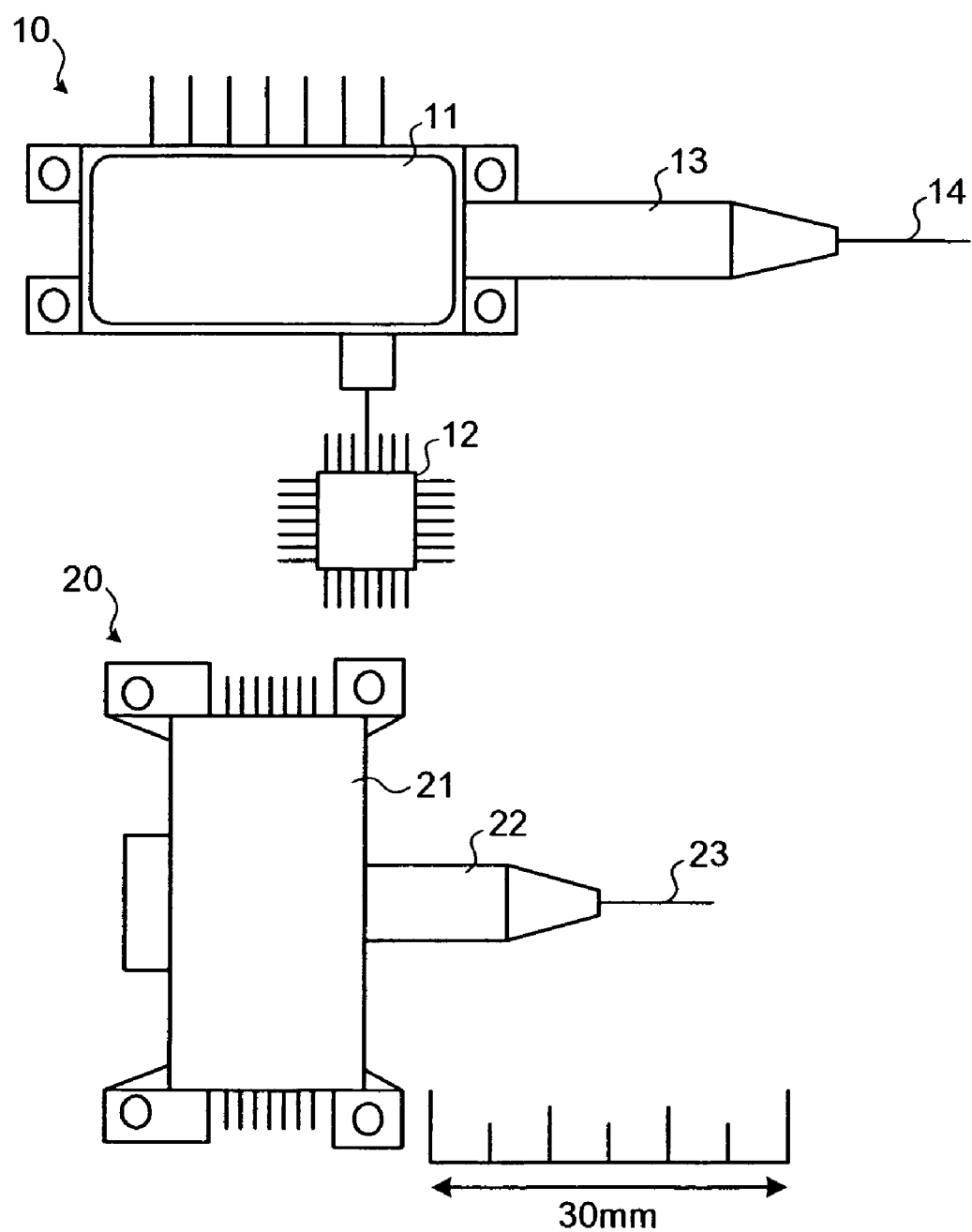
FIG. 11 is a top external view of an optical transmitter and an optical receiver in a conventional optical communication system.

Because of the compactness of the cooler 115 and provision of the notched portion 107a and the like, the optical transmitter 100 can be made smaller than the conventional optical transmitter 10 (Refer to FIG. 11.). Precisely, the length direction size f is 13 millimeters, the width direction size g is 6 millimeters, the distance h from a side surface 101a of the case 101 to the optical axis is 3 millimeters, and the height i is 6 millimeters.

Figure 7:
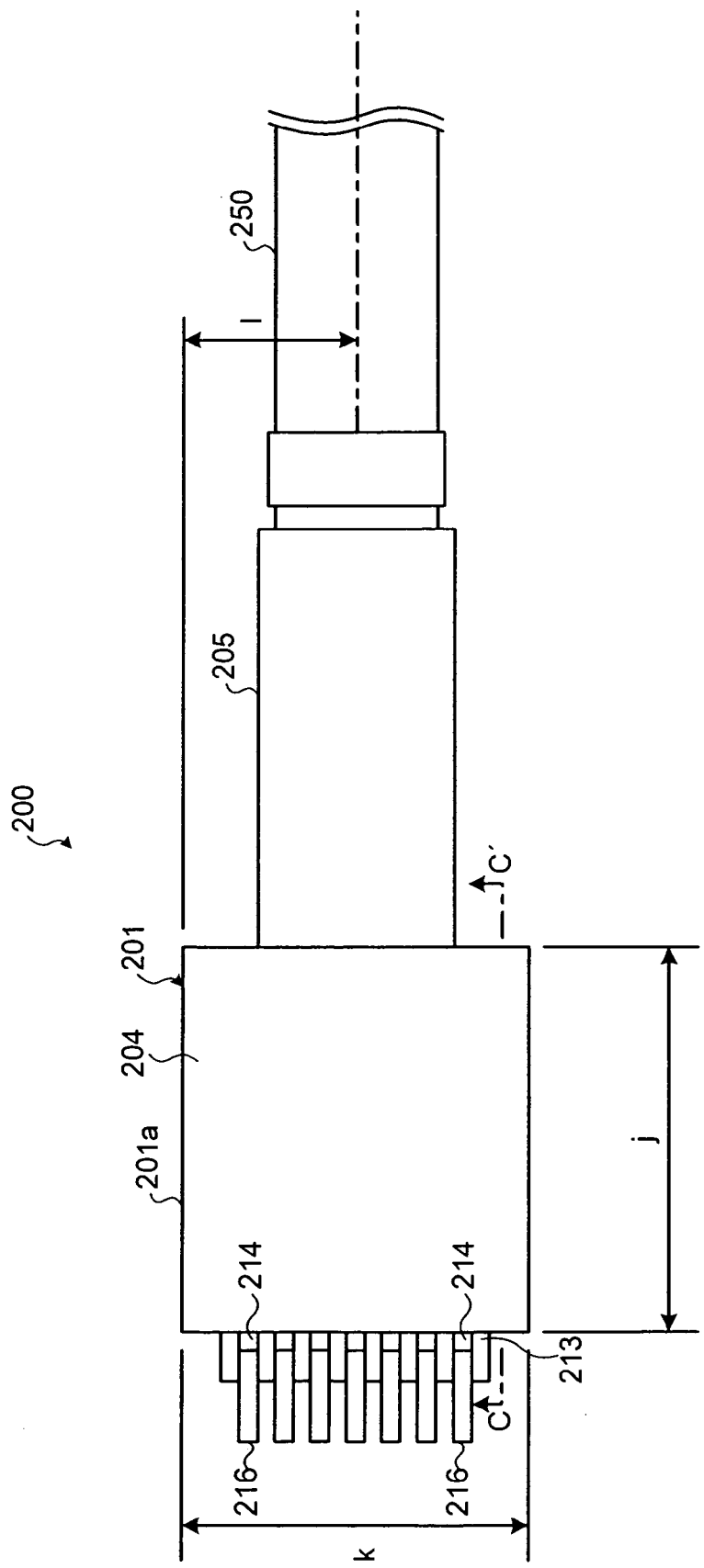
FIG. 7 is an enlarged top view of an external structure of an optical receiver shown in FIG. 1.
Figure 8:
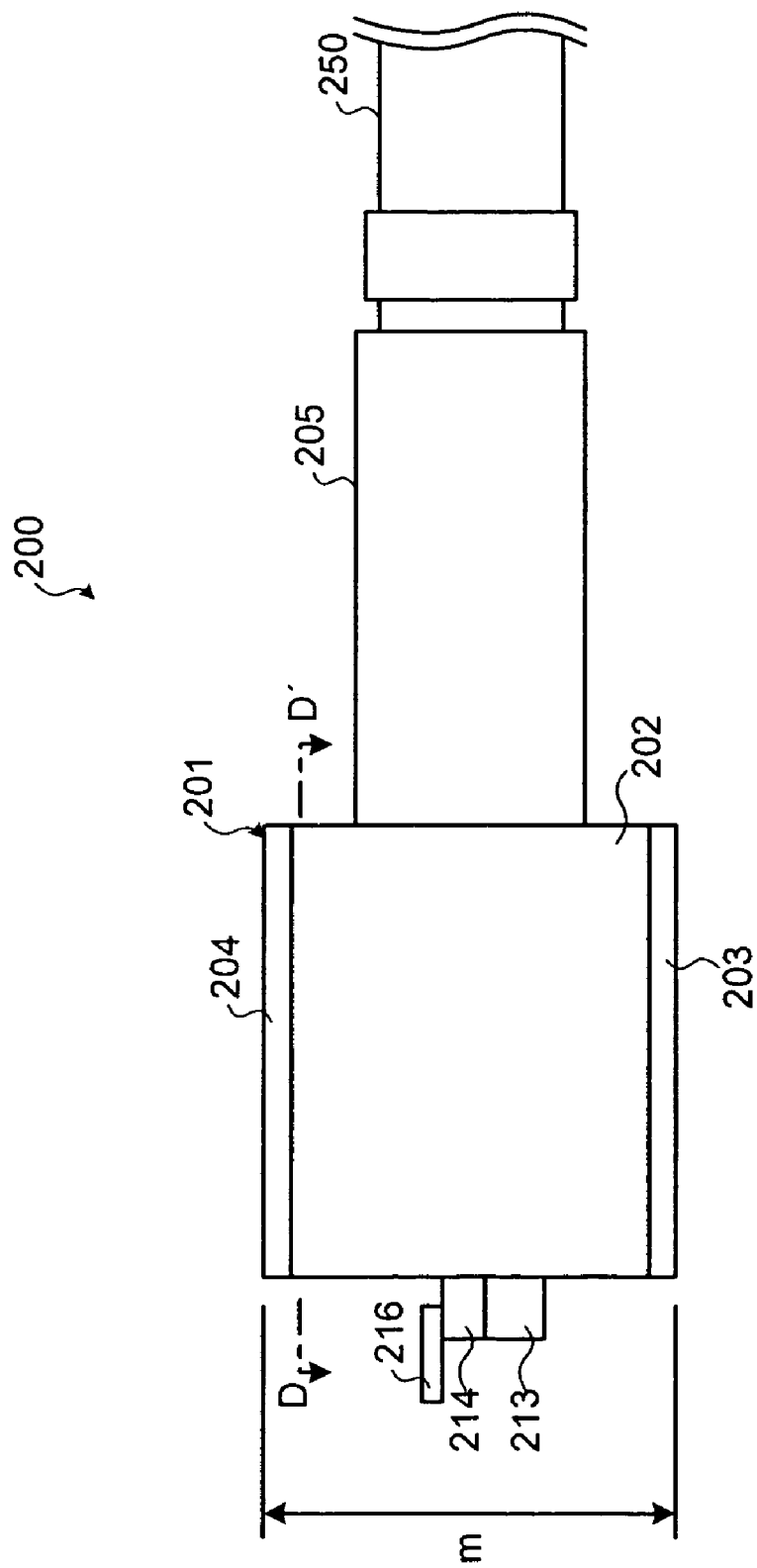
FIG. 8 is an enlarged side view of an external structure of the optical receiver 200 shown in FIG. 1.
Figure 9:
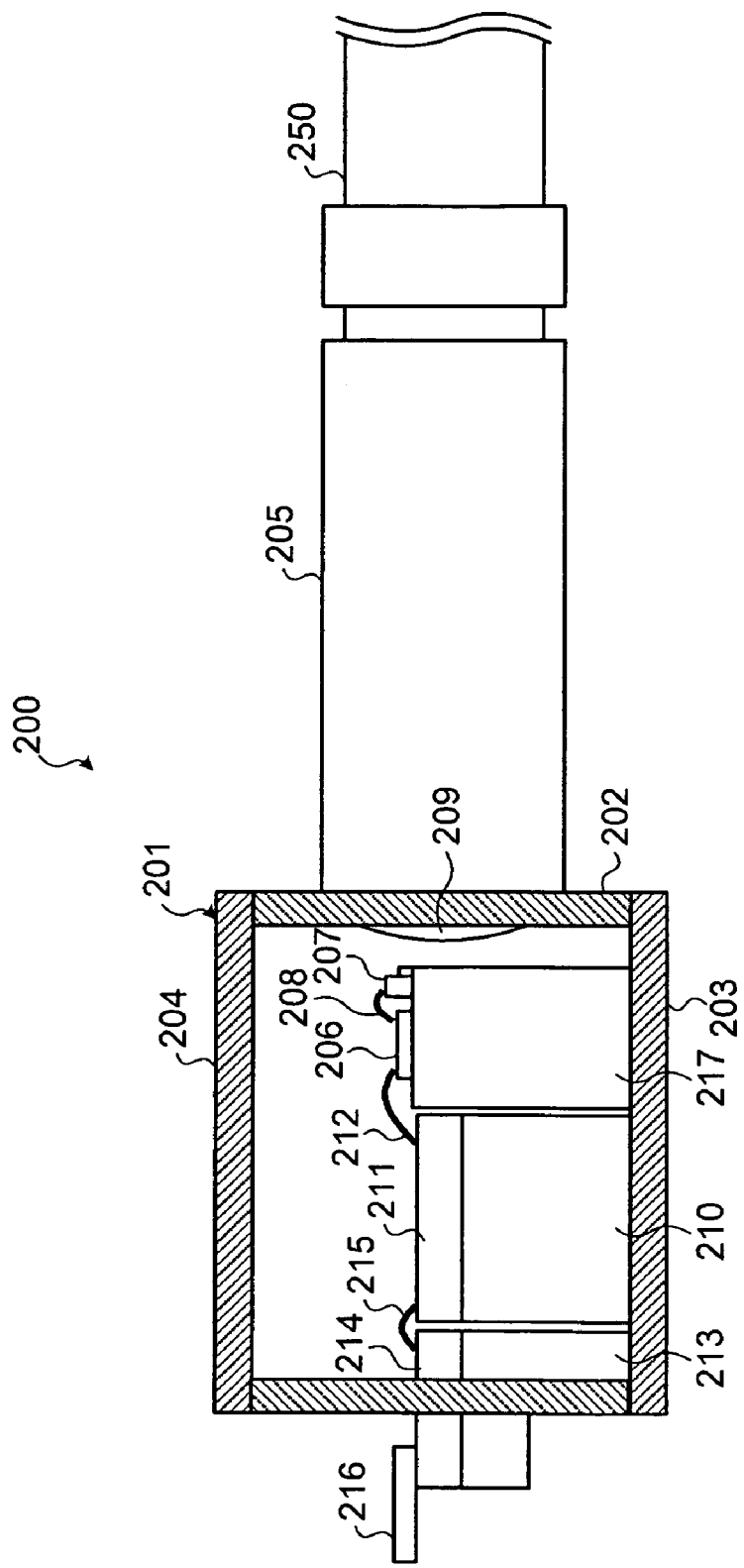
FIG. 9 is a cross sectional view along the line C-C' shown in FIG. 7.
Figure 10:
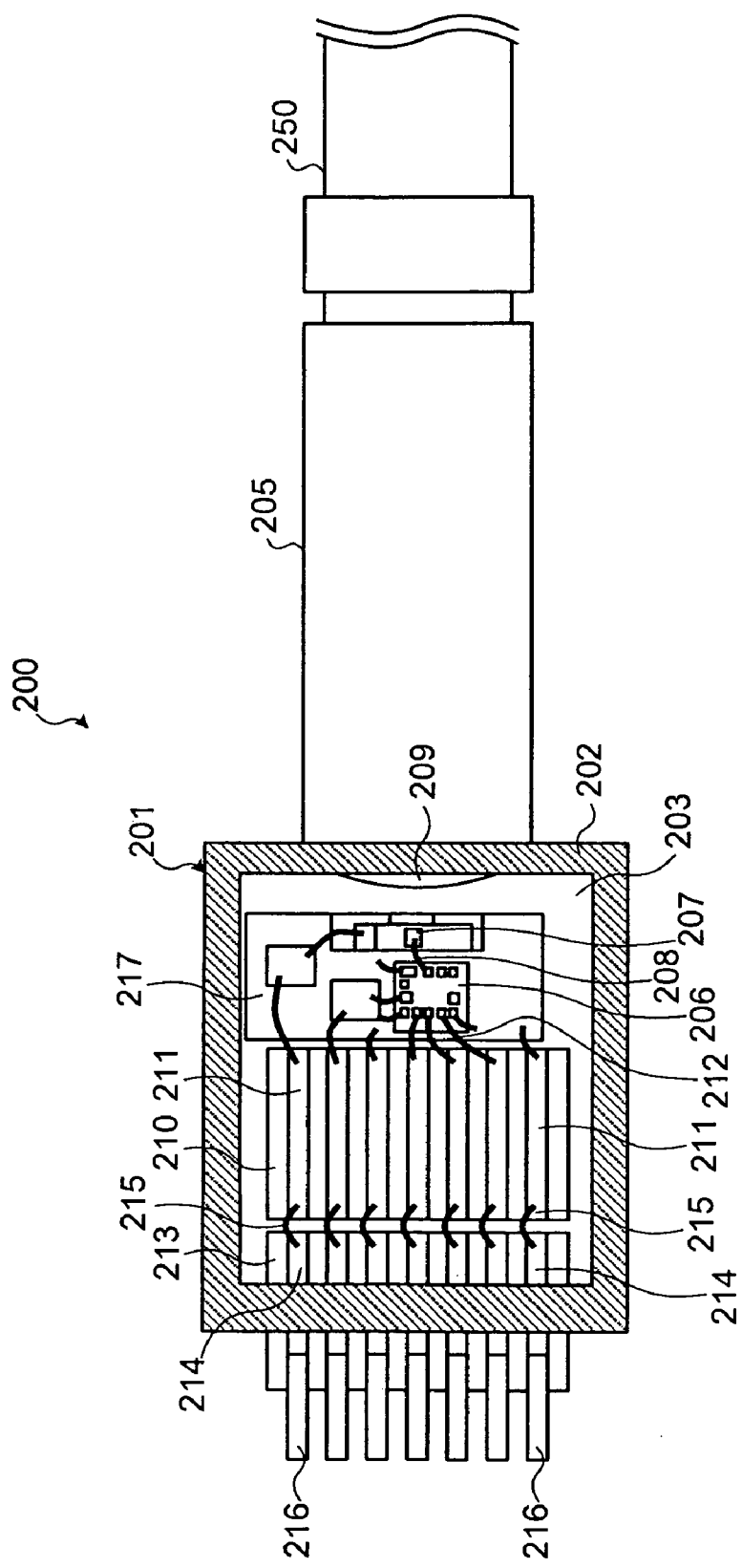
FIG. 10 is a cross sectional view along the line D-D' shown in FIG. 8.

The structure of the optical receiver 200 is explained in details hereinafter. FIG. 7 is an enlarged external view of the optical receiver 200. FIG. 8 is an enlarged external view of the optical receiver 200 from a different direction. FIG. 9 is a cross sectional view along the line C-C' shown in FIG. 7. FIG. 10 is a cross sectional view along the line D-D' shown in FIG. 8.

The optical receiver 200 includes a case 201. The case 201 is rectangular and hollow. The case 201 includes an enclosure member 202 of rectangular cross section (Refer to FIG. 10.), a lower member 203 that covers the lower surface of the enclosure member 202, and an upper member 204 that covers the upper surface of the enclosure member 202. This case 201 is made of a material having low heat conductivity, such as a Fe-Co-Ni alloy. The case 201 houses a preamplifier 206, a photo diode 207 and the like.

As shown in FIG. 9, an optical fiber tube 205 is jointed to the enclosure member 202. Into this optical fiber tube 205, an optical fiber 250 is inserted and fixed thereto. A base 217 is of a roughly rectangular shape, and is arranged in a portion that is on the right side in the lower member 203.

On the surface of the base 217, a preamplifier 206 and a photo diode 207 are arranged to be detachable in unit of block. Therefore, in the optical receiver 200, the preamplifier 206 and the photo diode 207 may be exchanged in unit of block. For example, in the optical receiver 200, in the case of nonconformity in test, such a nonconforming block (for example, the preamplifier 206) may be easily exchanged, and in the case of design changes, a block to be changed (for example, the photo diode 207) may be easily exchanged.

The preamplifier 206 amplifies electric signals from the photo diodes 207. The photo diode 207 receives a laser beam that comes through the optical fiber 250, and converts the laser beam concerned into electric signals, and outputs the signals to the preamplifier 206.

A wire 208 connects the preamplifier 206 and the photo diode 207. A lens 209 is arranged in the right area in the figure of the photo diode 207, and concentrates the laser beam that is ejected from the outgoing surface of the optical fiber 250, and leads the laser beam to the photo diode 207.

As shown in FIG. 10, a base 210 is arranged in the left area in the figure of the base 217. Relay terminals 211 are arranged on the base 210 at specified intervals. Wires 212 connect the relay terminals 211 and the respective terminals on the base 217.

A base 213 is arranged in the left area in the figure of the base 210, and part thereof protrudes outside from the enclosure member 202 (Refer to FIG. 9.). Relay terminals 214 correspond to the relay terminals 211, and are arranged on the surface of the base 213 at specified intervals.

Wires 215 connect the relay terminals 211 and the relay terminals 214. Terminals 216 are arranged at specified intervals to protrude outside from the enclosure member 202, and are connected to the relay terminals 214.

The optical receiver 200 is made into a smaller size in comparison with the conventional optical receiver 20 (Refer to FIG. 11.). In concrete, the length direction size j shown in FIG. 7 is 8 millimeters. The width direction size k is 6 millimeters. The distance I from a side surface 201a of the case 201 to the optical axis is 3 millimeters. Meanwhile, the height m shown in FIG. 8 is 6 millimeters.

Next, actions of the optical transmitter 100 are explained in reference to FIG. 5. As shown in FIG. 5, when the laser beam generator 118 is driven and controlled by the driver 108, a laser beam is ejected from the laser beam generator 118. This laser beam is converted into parallel light rays by the first lens 123, which are concentrated by the second lens 124, and enter the incident surface of the optical fiber 150, and go through the optical fiber 150.

Meanwhile, during the actions, heat generated in the laser beam generator 118 is conveyed to the cooler 115 via the support member 117 and the high heat conductivity member 116. The high heat conductivity member 116 is arranged on the entire surface of the cooler 115, and the heat barrier of the low-heat-conductivity/high-weldability member 121 is arranged, as a consequence, the heat generated in the laser beam generator 118 transfers to the cooler 115 at high efficiency.

Next, actions of the optical receiver 200 are explained in reference to FIG. 9. As shown in FIG. 9, the laser beam that comes through the optical fiber 250 is ejected from the outgoing surface, and is concentrated by the lens 209, and converted into electric signals by the photo diode 207. Heat generated in the preamplifier 206 and the photo diode 207 is spontaneously radiated.

When the optical transmitter 100 shown in FIG. 3 and the optical receiver 200 shown in FIG. 7 are contained into the case 301 shown in FIG. 2, and applied to an XFP standardized optical transmitter and receiver 300, the distance h from the side surface 101a of the case 101 to the optical axis (Refer to FIG. 3.) is 3 millimeters, while the distance I from the side surface 201a of the case 201 to the optical axis (Refer to FIG. 7.) is 3 millimeters, accordingly the distance c (Refer to FIG. 1.) becomes 6 millimeters, which conforms to the XFP standard explained previously.

So long as the distance c is 6 millimeters under the XFP standard, it is not necessary to limit both the width direction size g of the case 101 (Refer to FIG. 3.) and the width direction size k of the case 201 (Refer to FIG. 7.) to 6 millimeters, but the width direction size at one side may be small, and that of the other side may be large.

For example, when the width direction size k of the optical receiver 200 is 5 millimeters, the distance I from the side surface 201a of the case 201 to the optical axis is 2.5 millimeters. In this case, the width direction size g of the optical transmitter 100 may be expanded up to 7 millimeters, and the distance h from the side surface 101a of the case 101 to the optical axis is made 3.5 millimeters.

The distance c conforms to the XFP standard 6 millimeters (2.5 millimeters+3.5 millimeters). It is preferred that the distance h (or I) from the side surface 101a (or the side surface 201a) of the case 101 (or the case 201) is made equal to or less than 3.5 millimeters, or in the range from 2.5 millimeters to 3.5 millimeters.

Further, in the embodiment, the exemplary structure in which the low-heat-conductivity/high-weldability member 121 is arranged in between the high heat conductivity member 116 and the support member 122 shown in FIG. 5 has been explained, however, in the place of the low-heat-conductivity/high-weldability member 121, an adhesive that has a lower heat conductivity than that of the high heat conductivity member 116, and can physically join the high heat conductivity member 116 and the support member 122 firmly may be employed.

Furthermore, in the embodiment, the exemplary structure in which the low-heat-conductivity/high-weldability member 121 is arranged has been explained, however, when sufficient heat efficiency can be obtained, and the support member 122 can be firmly jointed to the high heat conductivity member 116, a structure may be made so that the support member 122 is jointed directly to the high heat conductivity member 116, without arranging the low-heat-conductivity/high-weldability member 121.

Moreover, in the embodiment, the exemplary structure in which the heat generated in the preamplifier 206 and the photo diode 207 shown in FIG. 9 is spontaneously radiated has been explained, however, in the case of a large heat amount, in the place of the base 217, members similar to the cooler 115 and the high heat conductivity member 116 may be arranged, thereby the heat may be forcibly radiated.

Further, in the embodiment, the cooling method of the cooler 115 is the cooling method by Peltier effect, however, the present invention is not limited to this, but other cooling method may be employed.

Furthermore, in the embodiment, the optical transmitter 100 and the optical receiver 200 may be either a type with an optical fiber at delivery or a type without an optical fiber at delivery (receptacle).

Moreover, in the embodiment, so long as problems in optical and space viewpoints are cleared, it is not always necessary to arrange the first lens 123 shown in FIG. 5 on the cooler 115, but the first lens 123 (the support member 122) may be arranged in the right area in the figure from the cooler 115.

As explained heretofore, according to the embodiment, the laser beam generator 118, the first lens 123, and the cooler 115 are arranged in the case 101, and the high heat conductivity member 116 that has a higher heat conductivity than that of the case 101, and leads heat generated in the laser beam generator 118 to the cooler 115 is arranged, therefore, it is possible to make the size of the cooler 115 small through high heat efficiency, and to obtain a compact size.

Further, the case 101 is made of a Fe-Co-Ni alloy, and the high heat conductivity member 116 is made of copper tungsten, therefore, it is possible to make the size of the cooler 115 small through high heat efficiency, and to obtain a compact size.

Furthermore, according to the embodiment, the low-heat-conductivity/high-weldability member 121 that is placed in between the high heat conductivity member 116 and the first lens 123, and has a higher heat conductivity than that of the high heat conductivity member 116 is arranged, therefore, it is possible to reduce the amount of the heat that is generated in the laser beam generator 118 and transfers to the lens 123 side, and to lead the heat to the cooler 115 at high efficiency.

Moreover, according to the embodiment, the support member 117 that supports the laser beam generator 118 and is jointed to the high heat conductivity member 116, and the support member 122 that supports the first lens 123 and is jointed to the low-heat-conductivity/high-weldability member 121 are arranged, consequently, the heat is led via the support member 117 to the cooler 115, therefore, it is possible to make the size of the cooler 115 small through high heat efficiency, and to obtain a compact size.

Further, according to the embodiment, the low-heat-conductivity/high-weldability member 121 that is placed in between the high heat conductivity member 116 and the support member 122, and has a lower heat conductivity than that of the high heat conductivity member 116 is arranged, therefore, it is possible to reduce the amount of the heat that is generated in the laser beam generator 118 and transfers to the lens 123 side, and to lead the heat to the cooler 115 at high efficiency.

Furthermore, according to the embodiment, the high heat conductivity member 116 and the support member 122 are jointed with an adhesive that has a lower heat conductivity than that of the high heat conductivity member 116, therefore, it is possible to reduce the amount of the heat that is generated in the laser beam generator 118 and transfers to the lens 123 side, and to lead the heat to the cooler 115 at high efficiency.

Moreover, according to the embodiment, the low-heat-conductivity/high-weldability member 121 is made of a Fe-Co-Ni alloy, therefore, it is possible to reduce the amount of the heat that is generated in the laser beam generator 118 and transfers to the lens 123 side, and to lead the heat to the cooler 115 at high efficiency.

Further, according to the embodiment, the high frequency board 107 in which the notched portion 107a for containing the laser beam generator 118 is formed, and the driver 108 that is placed on the high frequency board 107, and drives and controls the laser beam generator 118 are arranged, therefore, it is possible to make wires 119 shortest under the conditions for a compact size (for example, the width size g being 6 millimeters), and to maintain high frequency properties.

Furthermore, according to the embodiment, the distance h from the side surface of the case 101 to the optical axis of the optical fiber 150 (Refer to FIG. 3.) is made equal to or less than 3.5 millimeters, therefore, it is possible to cope with the compact size of the optical transmitter 100 in a specified standard (for example, the XFP standard).

Moreover, according to the embodiment, the distance h from the side surface of the case 101 to the optical axis of the optical fiber 150 (Refer to FIG. 3.) is made 2.5 millimeters to 3.5 millimeters, therefore, it is possible to cope with the compact size of the optical transmitter 100 in a specified standard.

Further, according to the embodiment, the distance h from the side surface of the case 101 to the optical axis of the optical fiber 150 (Refer to FIG. 3.) is made 3 millimeters, therefore, it is possible to cope with the compact size of the optical transmitter 100 in a specified standard.

Furthermore, according to the embodiment, the width direction size g of the case 101 (Refer to FIG. 3.) is made 6 millimeters, therefore, it is possible to cope with the compact size of the optical transmitter 100 in a specified standard.

Moreover, according to the embodiment, in an optical communication system using the optical transmitter 100, it is possible to obtain a compact size and to maintain high frequency properties.

Further, according to the embodiment, the photo diode 207 and the preamplifier 206 are arranged in the case 201, and the photo diode 207 and the preamplifier 206 are supported to be detachable in unit of block, therefore, it is possible to easily exchange a nonconforming block or a block to be exchanged, and to increase easy modifications in tests and designs.

Furthermore, according to the embodiment, the cooler that cools down the heat generated in the photo diode 207 and the preamplifier 206 arranged in the case 201 is arranged, therefore, it is possible to use the photo diode 207 and the preamplifier 206 with a large amount of heat dissipation.

Moreover, according to the embodiment, the high heat conductivity member that is placed in between the photo diode 207 and the preamplifier 206, and has a higher heat conductivity than that of the case 201, and leads the heat generated in the photo diode 207 and the preamplifier 206 respectively to the cooler is arranged, therefore, it is possible to make the size of the cooler small through high heat efficiency, and to obtain a compact size.

Further, according to the embodiment, the case 201 is made of a Fe-Co-Ni alloy, and the high heat conductivity member is made of copper tungsten, therefore, it is possible to make the size of the cooler small through high heat efficiency, and to obtain a compact size.

Furthermore, according to the embodiment, the distance I from the side surface of the case 201 to the optical axis of the optical fiber 250 (Refer to FIG. 7.) is made equal to or less than 3.5 millimeters, therefore, it is possible to cope with the compact size of an optical receiver in a specified standard.

Moreover, according to the embodiment, the distance I from the side surface of the case 201 to the optical axis of the optical fiber 250 (Refer to FIG. 7.) is made 2.5 millimeters to 3.5 millimeters, therefore, it is possible to cope with the compact size of an optical receiver in a specified standard.

Further, according to the embodiment, the distance I from the side surface of the case 201 to the optical axis of the optical fiber 250 (Refer to FIG. 7.) is made 3 millimeters, therefore, it is possible to cope with the compact size of the optical receiver 200 in a specified standard.

Furthermore, according to the embodiment, the width direction size k of the case 201 (Refer to FIG. 7.) is made 6 millimeters, therefore, it is possible to cope with the compact size of the optical receiver 200 in a specified standard.

Moreover, according to the embodiment, in an optical communication system using the optical receiver 200, it is possible to reduce exchange costs, and to obtains a compact size.

Further, according to the embodiment, in the XFP standardized optical transmitter and receiver 300, it is possible to obtain a compact size, to maintain high frequency properties, and to reduce exchange costs.

According to the present invention, because a high heat conductivity member conveys the heat generated in the laser beam generating unit to the cooling unit, the heat can be conveyed efficiently. As a result, a small-sized cooling unit can be employed so that the overall size can be made compact.

Furthermore, according to the present invention, the low heat conductivity member that is placed in between the high heat conductivity member and the lens, and has a lower heat conductivity than that of the high heat conductivity member is arranged, therefore, there is an advantage that it is possible to reduce the amount of the heat that is generated in the laser beam generating unit and transfers to the lens side, and to lead the heat to the cooling unit at high efficiency.

Moreover, according to the present invention, the first support member that supports the laser beam generating unit and is jointed to the high heat conductivity member, and the second support member that supports the lens and is jointed to the high heat conductivity member are arranged, consequently, the heat is led via the first support member to the cooling unit, therefore, there is an advantage that it is possible to make the size of the cooling unit small through high heat efficiency, and to obtain a compact size.

Further, according to the present invention, the low heat conductivity member that is placed in between the high heat conductivity member and the second support member, and has a lower heat conductivity than that of the high heat conductivity member is arranged, therefore, there is an advantage that it is possible to reduce the amount of the heat that is generated in the laser beam generating unit and transfers to the lens side, and to lead the heat to the cooling unit at high efficiency.

Furthermore, according to the present invention, the high heat conductivity member and the second support member are jointed with an adhesive that has a lower heat conductivity than that of the high heat conductivity member, therefore, there is an advantage that it is possible to reduce the amount of the heat that is generated in the laser beam generating unit and transfers to the lens side, and to lead the heat to the cooling unit at high efficiency.

Moreover, according to the present invention, the low heat conductivity member is made of a Fe-Co-Ni alloy, therefore, there is an advantage that it is possible to reduce the amount of the heat that is generated in the laser beam generating unit and transfers to the lens side, and to lead the heat to the cooling unit at high efficiency.

Further, according to the present invention, the board in which a notched portion for containing the laser beam generating unit is formed, and the driver that is arranged on the board, and drives and controls the laser beam generating unit are arranged, therefore, there is an advantage that it is possible to make lead wires shorter and achieve compact sizeain high frequency properties.

Furthermore, according to the present invention, the distance from the side surface of the case to the optical axis of the optical fiber is made equal to or less than 3.5 millimeters, therefore, there is an advantage that it is possible to cope with the compact size of an optical transmitter in a specified standard.

Moreover, according to the present invention, the distance from the side surface of the case to the optical axis of the optical fiber is made 2.5 millimeters to 3.5 millimeters, therefore, there is an advantage that it is possible to cope with the compact size of an optical transmitter in a specified standard.

Further, according to the present invention, the distance from the side surface of the case to the optical axis of the optical fiber is made 3 millimeters, therefore, there is an advantage that it is possible to cope with the compact size of an optical transmitter in a specified standard.

Furthermore, according to the present invention, the width direction size of the case is made 6 millimeters, therefore, there is an advantage that it is possible to cope with the compact size of an optical transmitter in a specified standard.

Moreover, according to the present invention, in an optical communication system using an optical transmitter, there is an advantage that it is possible to obtain a compact size and to maintain high frequency properties.

Further, according to the present invention, the light receiving unit and the amplifying unit are arranged in the case, and the light receiving unit and the amplifying unit are supported to be detachable in unit of block, therefore, there is an advantage that it is possible to easily exchange a nonconforming block or a block to be exchanged, and to increase easy modifications in tests and designs.

Furthermore, according to the present invention, the cooling unit that cools down the heat generated in the light receiving unit and the amplifying unit arranged in the case is arranged, therefore, there is an advantage that it is possible to use a light receiving unit and an amplifying unit with a large amount of heat dissipation.

Moreover, according to the present invention, the high heat conductivity member that is placed in between the light receiving unit and the amplifying unit, and has a higher heat conductivity than that of the case, and leads the heat generated in the light receiving unit and the amplifying unit respectively to the cooling unit is arranged, therefore, there is an advantage that it is possible to make the size of the cooling unit small through high heat efficiency, and to obtain a compact size.

Further, according to the present invention, the case is made of a Fe-Co-Ni alloy, and the high heat conductivity member is made of copper tungsten, therefore, there is an advantage that it is possible to make the size of the cooling unit small through high heat efficiency, and to obtain a compact size.

Furthermore, according to the present invention, the distance from the side surface of the case to the optical axis of the optical fiber is made equal to or less than 3.5 millimeters, therefore, there is an advantage that it is possible to cope with the compact size of an optical receiver in a specified standard.

Moreover, according to the present invention, the distance from the side surface of the case to the optical axis of the optical fiber is made 2.5 millimeters to 3.5 millimeters, therefore, there is an advantage that it is possible to cope with the compact size of an optical receiver in a specified standard.

Further, according to the present invention, the distance from the side surface of the case to the optical axis of the optical fiber is made 3 millimeters, therefore, there is an advantage that it is possible to cope with the compact size of an optical receiver in a specified standard.

Furthermore, according to the present invention, the width direction size of the case is made 6 millimeters, therefore, there is an advantage that it is possible to cope with the compact size of an optical receiver in a specified standard.

Moreover, according to the present invention, in an optical communication system using an optical receiver, there is an advantage that it is possible to reduce exchange costs, and to make the size compact.

Further, according to the present invention, in an optical transmitter and receiver, there is an advantage that it is possible to obtain a compact size, to maintain high frequency properties, and to reduce exchange costs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An optical transmitter configured to transmit a laser beam through an optical fiber, comprising:
   a case;
   a laser beam generating unit in the case and configured to generate the laser beam;
   a first support member in the case, and having a first wiring pattern and configured to support the laser beam generating unit;
   a board in the case, and having a second wiring pattern, and a notched portion containing the first support member and the laser beam generating unit;
   a first wire in the case, and configured to connect the first wiring pattern and the second wiring pattern;
   a second support member positioned in the notched portion and having a third wiring pattern;
   a photo diode positioned in the notched portion, supported by the second support member, electrically connected to the third wiring pattern, and configured to measure the laser beam generated by the laser beam generating unit;
   a second wire in the case, and electrically connecting the second wiring pattern and the third wiring pattern;

a driver on the board, the driver being electrically connected to the laser beam generating unit through the first wiring pattern, the first wire, and the second wiring pattern, and configured to drive and control the laser beam generating unit;

a cooling unit in the case;

a high heat conductivity member in the case, contacting a top surface of the cooling unit, disposed under the first support member, and having higher heat conductivity than the case; and a low heat conductivity member in the case, contacting a half of a top surface of the high heat conductivity member, and having lower heat conductivity than the high heat conductivity member, wherein the case comprises an Fe—Co—Ni alloy, the high heat conductivity member comprises copper tungsten, a distance between a side surface of the case and an optical axis of the optical fiber is equal to or less then 3.5 millimeters, and the case has a width of 6 millimeters, a length of 13 millimeters, and a height of 6 millimeters.

2. The optical transmitter according to claim 1, further comprising
a lens in the case and configured to lead the laser beam to the optical fiber, wherein; and
a the low heat conductivity member is disposed between the high heat conductivity member and the lens.

3. The optical transmitter according to claim 1, further comprising a third support member jointed to the high heat conductivity member, wherein the first support member is jointed to the high heat conductivity member.

4. The optical transmitter according to claim 3, wherein the low heat conductivity member is between the high heat conductivity member and the third support member.

5. The optical transmitter according to claim 4, wherein the low heat conductivity member comprises a Fe—Co—Ni alloy.

6. The optical transmitter according to claim 3, wherein the low heat conductivity member is an adhesive jointing the high heat conductivity member and the third support member.

7. The optical transmitter according to claim 1, wherein the distance between the side surface of the case and the optical axis of the optical fiber is between 2.5 millimeters and 3.5 millimeters.

8. The optical transmitter according to claim 1, wherein the distance between the side surface of the case and the optical axis of the optical fiber is substantially 3 millimeters.

9. An optical transmitter and receiver, comprising the optical transmitter of claim 1 and an optical receiver, the optical receiver comprising:
a case;
a light receiving unit in the case and configured to convert a laser beam that comes through an optical fiber into electric signals;
an amplifying unit in the case and configured to amplify the electric signals;
a support member in the case, wherein the support member is configured to support the light receiving unit and the amplifying unit such that each of the light receiving unit and the amplifying unit is independently detachable, and the support member has a cooling unit configured to cool down heat generated in the light receiving unit and the amplifying unit; and
a high heat conductivity member between the cooling unit and the light receiving unit and between the cooling unit and the amplifying unit, wherein the high heat conductivity member has a higher heat conductivity than the case and is configured to convey heat generated in the light receiving unit and the amplifying unit to the cooling unit; wherein
a distance between a side surface of the case and an optical axis of the optical fiber is equal to or less than 3.5 millimeters.

10. The optical transmitter and receiver according to claim 9, wherein
the case comprises a Fe—Co—Ni alloy; and
the high heat conductivity member comprises copper tungsten.

11. The optical transmitter and receiver according to claim 9, wherein a distance between a side surface of the case and an optical axis of the optical fiber is between 2.5 millimeters and 3.5 millimeters.

12. The optical transmitter and receiver according to claim 9, wherein a distance between a side surface of the case and an optical axis of the optical fiber is substantially 3 millimeters.

13. The optical transmitter and receiver according to claim 9, wherein the case has a width of 6 millimeters.

14. An optical communication system, comprising the optical transmitter of claim 1 and an optical receiver, the optical receiver comprising:
a case;
a light receiving unit in the case and configured to convert a laser beam that comes through an optical fiber into electric signals;
an amplifying unit in the case and configured to amplify the electric signals;
a support member in the case, wherein the support member is configured to support the light receiving unit and the amplifying unit such that each of the light receiving unit and the amplifying unit is independently detachable, and the support member has a cooling unit configured to cool down heat generated in the light receiving unit and the amplifying unit; and
a high heat conductivity member between the cooling unit and the light receiving unit and between the cooling unit and the amplifying unit, wherein the high heat conductivity member has a higher heat conductivity than the case and is configured to convey heat generated in the light receiving unit and the amplifying unit to the cooling unit; wherein
a distance between a side surface of the case and an optical axis of the optical fiber is equal to or less than 3.5 millimeters.

15. The optical communication system according to claim 14, wherein
the case comprises a Fe—Co—Ni alloy; and
the high heat conductivity member comprises copper tungsten.

16. The optical communication system according to claim 14, wherein a distance between a side surface of the case and an optical axis of the optical fiber is between 2.5 millimeters and 3.5 millimeters.

17. The optical communication system according to claim 14, wherein a distance between a side surface of the case and an optical axis of the optical fiber is substantially 3 millimeters.

18. The optical communication system according to claim 14, wherein the case has a width of 6 millimeters.

* * * * *